United States Patent [19]

Yuguchi

[11] Patent Number: 5,761,487
[45] Date of Patent: Jun. 2, 1998

[54] SEQUENTIAL NETWORK OPTIMIZATION DESIGNING APPARATUS

[75] Inventor: Masayuki Yuguchi, Tokyo, Japan

[73] Assignee: NEC Corporation, Tokyo, Japan

[21] Appl. No.: 647,734

[22] Filed: May 15, 1996

[30] Foreign Application Priority Data

May 15, 1995 [JP] Japan ..................... 7-139980

[51] Int. Cl.[6] .................................................. G06F 17/50
[52] U.S. Cl. ........................... 395/500; 364/489; 364/490
[58] Field of Search ...................................... 364/488, 489, 364/578; 395/500, 568

[56] References Cited

U.S. PATENT DOCUMENTS 5,461,573 10/1995 Chakradhar et al. ................. 364/489

FOREIGN PATENT DOCUMENTS 7-56972 3/1995 Japan ..................... G06F 17/50

OTHER PUBLICATIONS

Touati et al., "Computing the Initial States of Retimed Circuits", IEEE, 1993, pp. 157–162.
Ashar et al., "Implied State Transition Graphs: Applications to Sequential Logic Synthesis and Test", IEEE, 1990, pp. 84–87.
Sentovich et al., "Sequential Circuit Design Using Synthesis and Optimization", IEEE, 1992, pp. 328–333.
S. Malik et al., "Retiming and Resynthesis: Optimizing Sequential Networks with Combinational Techniques", IEEE Transactions on Computer-Aided Design, vol. 10, No. 1, Jan. 1991, pp. 74–84.
M. Yuguchi et al., "Multi-Level Logic Minimization Based on Multi-Signal Implications", 32nd Design Automation Conference, Jun. 1995, pp. 658–662.
G. De Micheli, "Synchronous Logic Synthesis: Algorithms for Cycle-Time Minimization", IEEE Transactions on Computer-Aided Design, vol. 10, No. 1, Jan. 1991, pp. 63–73.
L. Entrena et al., "Sequential Logic Optimization by Redundancy Addition and Removal", IEEE, 1993, pp. 310–315.

*Primary Examiner*—Kevin J. Teska
*Assistant Examiner*—Thai Phan
*Attorney, Agent, or Firm*—Foley & Lardner

[57] ABSTRACT

A sequential network optimization designing apparatus which can reduce the circuit scale of an object circuit taking the circuit logic across flip-flops into consideration without moving the flip-flops, and which can reduce the number of flip-flops of the object circuit. A subgraph extraction section extracts a subgraph from a flip-flop information attached transitive implication graph produced by a flip-flop information attached transitive implication graph production section. A subgraph transformation section transforms the subgraph so as to decrease the number of edges and the number of flip-flops of the subgraph. A subnetwork addition section generates a subnetwork corresponding to the transformed subgraph and adds the subnetwork to the sequential network. A redundancy removal section removes redundancies created in the sequential network by the addition of the subnetwork.

3 Claims, 9 Drawing Sheets

SEQUENTIAL NETWORK OPTIMIZATION DESIGNING APPARATUS

BACKGROUND OF THE INVENTION

1. Field of the Invention

This invention relates to an optimization designing apparatus for a sequential network which includes flip-flops and can hold internal states, and more particularly to a sequential optimization designing apparatus which designs a sequential network having a reduced circuit size (circuit area) and including a reduced number of flip-flops.

2. Description of the Related Art

Several sequential network optimization techniques are conventionally known.

An exemplary one of conventional sequential network optimization techniques is disclosed in S. Malik, E. M. Sentovich, R. K. Brayton and A. Sangiovanni-Vincentelli, "Retiming and Resynthesis: Optimizing Sequential Networks with Combinational Techniques", IEEE Trans. on CAD, Vol. 10, No. 1, January 1991. According to the technique, optimization is performed in a process including the following steps ① to ③:

① First, in a sequential network of an object of optimization, flip-flops which can be moved are moved toward the primary inputs or the primary outputs of the sequential network to expand a combinational circuit component which does not include flip-flops.

② Then, the combinational circuit component is resynthesized so as to minimize the circuit size.

③ Finally, the flip-flops which have been moved at ① are returned to their optimum positions.

The sequential network optimization technique, however, has the following problems ① to ③:

① The type of a circuit to which the technique can be applied is limited to a pipelined circuit.

② It is difficult to detect flip-flops which can be moved, to select those flip-flops which are effective to reduce the circuit scale (those flip-flops to be moved) and to determine optimum positions to which the moved flip-flips are to be returned.

③ Reduction in number of flip-flops cannot be taken into consideration.

Another sequential network optimization technique is disclosed in Japanese Patent Laid-Open Application No. Heisei 7-56972 entitled "Logic Circuit Minimization Apparatus". According to the technique, optimization is performed by a process including steps ① and ② described below. It is to be mentioned that, although the application of the technique is not limited to the "technique for a combinational circuit component of a sequential network" described below, the technique is directed to optimization of any combinational circuit, but description here is restricted to optimization of a sequential network.

① A transitive implication graph which holds implication relationships between wiring line values (between the value of a certain wiring line and the value of another wiring line) in a combinational circuit component of a sequential network of an object of optimization is produced.

② Using the transitive implication graph produced at ①, addition of a subnetwork and removal of redundancies are repeated to reduce the circuit size of the combinational circuit component.

However, since the sequential network optimization technique just described is directed to optimization only of a combinational circuit component of a sequential network, a relying relationship of circuits across flip-flops, that is, the circuit logic across flip-flops, cannot be taken into consideration.

SUMMARY OF THE INVENTION

It is an object of the present invention to provide a sequential network optimization designing apparatus which can reduce the circuit size of an object circuit taking the circuit logic across flip-flops into consideration without moving the flip-flops.

It is another object of the present invention to provide a sequential network optimization designing apparatus which can reduce the circuit size and the number of flip-flops of an object circuit.

In order to attain the objects described above, according to the present invention, there is provided a sequential network optimization designing apparatus, comprising circuit inputting means for inputting a sequential network of an object of optimization, flip-flop information attached transitive implication graph production means for producing a flip-flop information attached transitive implication graph corresponding to the sequential network inputted by the circuit inputting means, subgraph extraction means for extracting a subgraph from the flip-flop information attached transitive implication graph produced by the flip-flop information attached transitive implication graph production means, subgraph transformation means for transforming the subgraph extracted by the subgraph extraction means so as to decrease the number of edges and the number of flip-flops of the subgraph, subnetwork addition means for generating a subnetwork corresponding to the subgraph transformed by the subgraph transform means and adding the subnetwork to the sequential network, redundancy removal means for moving redundancies created in the sequential network by the addition of the subnetwork by the subnetwork addition means, and circuit outputting means for outputting the sequential network optimized by the addition of the subnetwork by the subnetwork addition means and the removal of the redundancies by the redundancy removal means.

In the present invention, the implication relationship denotes a relationship by which, where a certain wiring line P (wiring line value) assumes a value x (0 or 1), when another wiring line Q on the output side of the wiring line P always assumes a value y (0 or 1), "there is an implication from P=x to Q=y".

The flip-flop information attached implication relationship denotes an expansion of an implication relationship, which is used for a combinational circuit, to a sequential network and denotes an implication relationship between wiring line values which include flip-flop information. Here, the flip-flop information denotes information representing, when the value of a wiring line Q (wiring line value) is settled to 0 or 1 after a fixed interval of time (including after an interval of time of 0) after a point of time at which the value of another wiring line P (wiring line value) is settled to 0 or 1, the fixed interval of time. More particularly, the flip-flop information is the number of clock periods after the value of the wiring line P is settled until the value of the wiring line Q is settled. This number can be considered, where only edge trigger type flip-flops are involved as flip-flops, to be the number of flip-flops existing on a path from the wiring line P to the wiring line Q (also in the following description, the wiring lines P and Q are used as words denoting arbitrary wiring lines in representation of an implication relationship or the like).

Further, in the flip-flop information attached implication graph is a graph for all wiring lines of a sequential circuit of an object of optimization, in which a condition wherein the value of a certain wiring line P (wiring line value) becomes x (0 or 1) is represented by a vertex Px, a condition wherein the value of another wiring line Q becomes y (0 or y) is represented by a vertex Qy, an implication relationship that, and, when the value of the wiring line P becomes x, the value of the wiring line Q becomes y without fail is represented by an edge which is a line segment from the vertex Px to the vertex Qy. Here, where the number of flip-flops on a path in a circuit from the wiring line P to the wiring line Q is z, the flip-flop number z is recorded as flip-flop information of the edge from the vertex Px to the vertex Qy. The "wiring line" denotes any of primary input wiring lines, primary output wiring lines and gate output wiring lines of a sequential network of an object of optimization, and wiring lines at the opposite terminals of a flip-flop are regarded as a same wiring line.

Further, the flip-flop information attached transitive implication graph denotes a flip-flop information attached implication graph wherein a path on a circuit which passes a plurality of wiring lines is represented by a single edge so as to be suited best for optimization of a sequential circuit.

In the sequential network optimization designing apparatus of the present invention, the circuit inputting means inputs a sequential network of an object of optimization, and the flip-flop information attached transitive implication graph production means produces a flip-flop information attached transitive implication graph corresponding to the sequential network inputted by the circuit inputting means. Then, the subgraph extraction means extracts a subgraph from the flip-flop information attached transitive implication graph produced by the flip-flop information attached transitive implication graph production means, and the subgraph transformation means transforms the subgraph extracted by the subgraph extraction means so as to decrease the number of edges and the number of flip-flops of the subgraph. Further, the subnetwork addition means generates a subnetwork corresponding to the subgraph transformed by the subgraph transform means and adds the subnetwork to the sequential network, and the redundancy removal means removes redundancies created in the sequential network by the addition of the subnetwork by the subnetwork addition means. Finally, the circuit outputting means outputs the sequential network optimized by the addition of the subnetwork by the subnetwork addition means and the removal of the redundancies by the redundancy removal means.

With the sequential network optimization designing apparatus, since a flip-flop information attached transitive implication graph is used, upon optimization designing of a sequential network, the circuit size (area of the network) can be reduced taking also the circuit logic across flip-flops into consideration without moving flip-flops. Consequently, there is an advantage that the circuit size of a sequential network of an object of optimization can be reduced with a high performance.

Further, since transformation of a subgraph extracted from the flip-flop information attached transitive implication graph can be performed suitably by the subgraph transformation means, there is another advantage that, simultaneously with the reduction of the circuit size, reduction of the number of flip-flops in the sequential network of the object of optimization can be achieved.

Furthermore, as a result of facilitation in optimization processing and so forth based on the advantages described above, there is a further advantage that reduction in storage capacity required for optimization and reduction in calculation time can be achieved and optimization designing also of a sequential network of a large scale can be performed suitably by the sequential network optimization designing apparatus.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
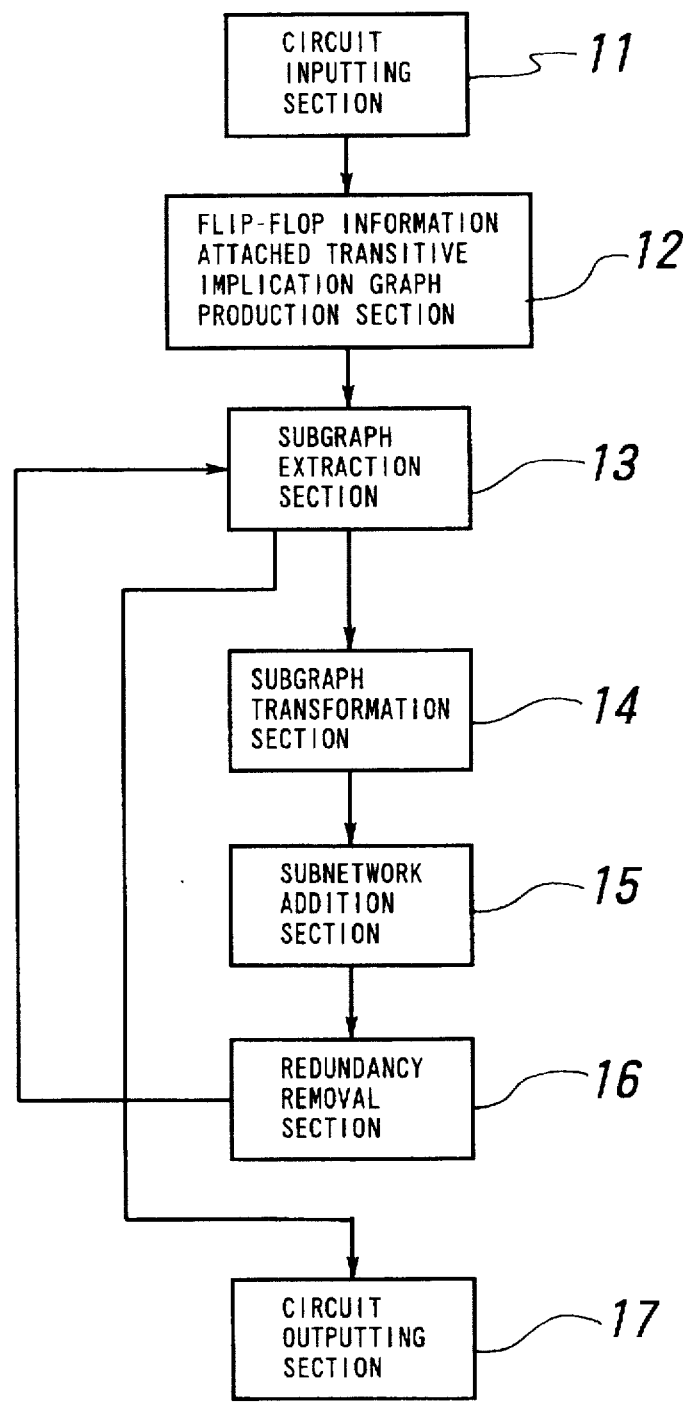
FIG. 1 is a block diagram of a sequential network optimization designing apparatus showing a preferred embodiment of the present invention.

Referring to FIG. 1, there is shown a sequential network optimization designing apparatus to which the present invention is applied. The sequential network optimization designing apparatus shown includes a circuit inputting section 11, a flip-flop information attached transitive implication graph production section 12, a subgraph extraction section 13, a subgraph transformation section 14, a subnetwork addition section 15, a redundancy removal section 16 and a circuit outputting section 17.

Figure 2:
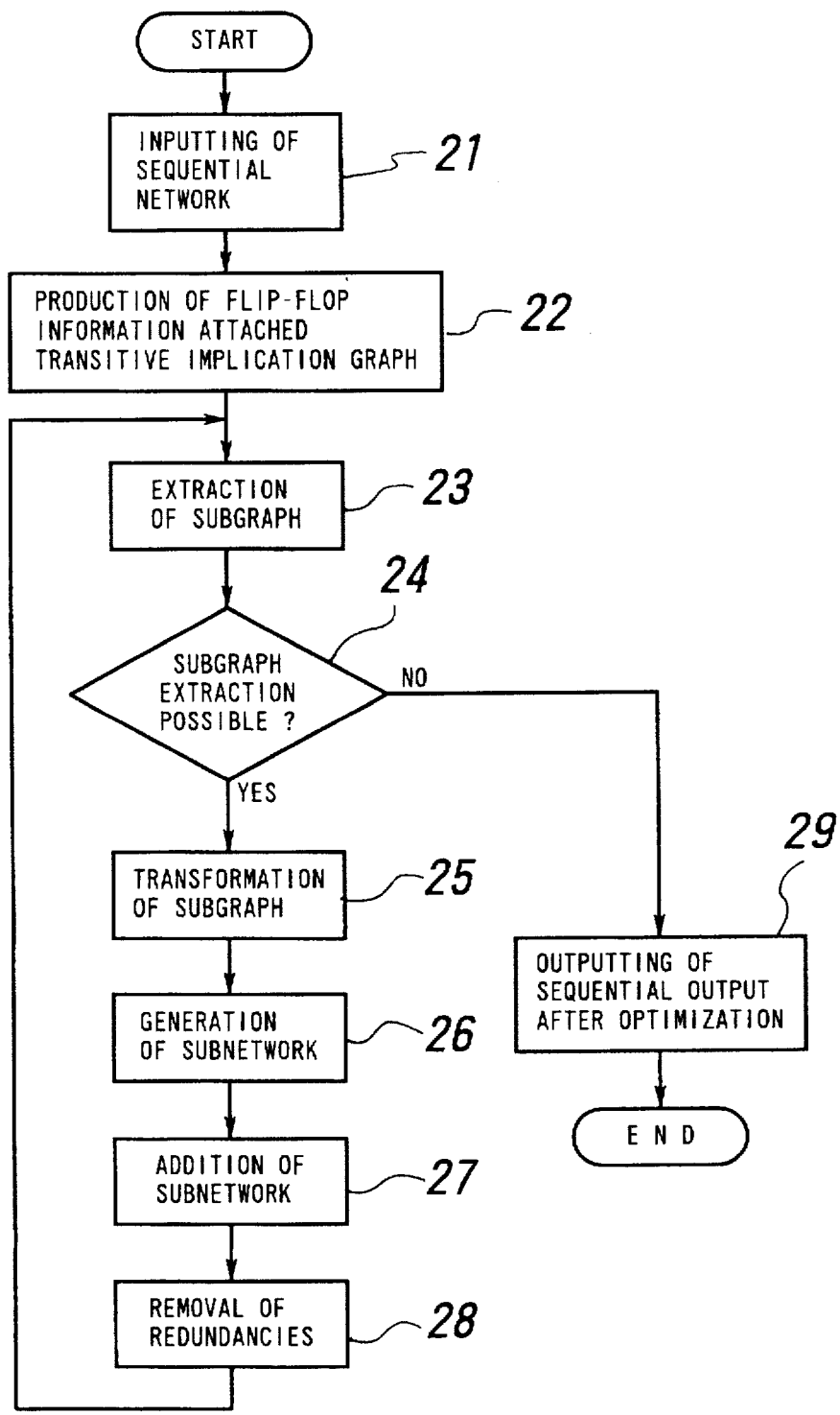
FIG. 2 is a flow chart illustrating processing of the sequential network optimization designing apparatus of FIG. 1.

FIG. 2 illustrates, in a flow chart, processing of the sequential network optimization designing apparatus. Referring to FIG. 2, the processing illustrated includes a sequential network inputting step 21, a flip-flop information attached transitive implication graph production step 22, a subgraph extraction step 23, an extraction possibility determination step 24, a subgraph transformation step 25, a subnetwork generation step 26, a subnetwork addition step 27, a redundancy removal step 28, and an optimized sequential network outputting step 29.

Operation of the sequential network optimization designing apparatus constructed in such a manner as described above will be described below.

The circuit inputting section 11 inputs a sequential network of an object of optimization (step 21).

The flip-flop information attached transitive implication graph production section 12 produces a flip-flop information attached transitive implication graph indicating flip-flop information attached implication relationships in the sequential network (step 22).

A flip-flop information attached transitive implication graph of the type 1 or the type 2 described below can be set.

The flip-flop information attached transitive implication graph of the type 1 is a flip-flop information attached transitive implication graph which includes, where a wiring line P and another wiring line Q in the sequential network of the object of optimization are presumed, an edge from a vertex Px to another vertex Qy when the following conditions ① to ⑤ are met.

① In the sequential network of the object of optimization, there is the wiring line Q on the output side of the wiring line P.

② There is an implication from P=x to Q=y (including an implication with which Q=y is reached after a fixed interval of time after a point of time at which P=x is reached. A fixed interval time corresponds to the number of flip-flops which are on a path from the wiring line P to the wiring line Q).

③ Where the wiring line P is a wiring line other than primary input wiring lines of the sequential network of the object of optimization, at least one wiring line of the output wiring lines of the wiring line P (the output wiring lines are output lines of the gate, one of whose inputs is the wiring line P) does not have an implication from P=x.

④ Where the wiring line Q is a wiring line other than primary output wiring lines of the sequential network of the object of optimization, at least one wiring line of the output wiring lines of the wiring line Q does not have an implication from Q=y.

⑤ All wiring lines which are on the path from the wiring line P to the wiring line Q have an implication from P=x.

The flip-flop information attached transitive implication graph of the type 2 is a flip-flop information attached transitive implication graph which includes, where the wiring line P and the wiring line Q in the sequential network of the object of optimization are presumed, an edge from a vertex Px to another vertex Qy when the following requirements ① are ④ are met.

① In the sequential network of the object of optimization, there is the wiring line Q on the output side of the wiring line P.

② There is an implication from P=x to Q=y (including an implication with which Q=y is reached after a fixed interval of time after a point of time at which P=x is reached. A fixed interval time which corresponds to the number of flip-flops which are on a path from the wiring line P to the wiring line Q).

③ There is no implication from a wiring on the input side of the wiring line P to A=x.

④ There is no implication from B=y to a wiring line on the output side of the wiring line B.

Use of such a flip-flop information attached transitive implication graph allows "reduction of the circuit area of a sequential network" which takes a relying relationship of circuits on the front and the rear of flip-flops, that is, the circuit logic across flip-flops into consideration. Further, even if the circuit scale of the sequential network inputted by the circuit inputting section 11 increases, the scale of the flip-flop information attached transitive implication graph does not exhibit an exponential increase. Accordingly, also where a sequential network of the object of optimization has a large scale, a flip-flop information attached transitive implication graph regarding the sequential network can be produced readily at a high speed.

The subgraph extraction section 13 extracts a subgraph of the flip-flop information attached transitive implication graph produced by the flip-flop information attached transitive implication graph production section 12 (step 23).

In particular, the subgraph extraction section 13 successively takes notice of each vertex of the flip-flop information attached transitive implication graph (except vertices corresponding to primary output wiring lines of the sequential network of the object of optimization) and extracts, considering the vertex as a reference vertex, a subgraph relating to the reference vertex in accordance with a procedure including the steps ① to ④ described below (for each of such subgraphs, a subnetwork to be added is produced by the subnetwork addition section 15 which will be hereinafter described).

① The reference vertex itself is extracted.

② Vertices which have the same outgoing edge ends with the reference vertex and vertices of the edge end are extracted. It is to be noted that, where there is no vertex which has the same outgoing edge end with the reference vertex, extraction of the subgraph may be avoided. This is because the possibility of reduction of the circuit area with such a subgraph is low and it is useful for increase in speed of processing to reduce subgraphs to be extracted.

③ Edges which interconnect the reference vertex or the "vertices having the same outgoing edge ends with the reference vertex" and the vertices of the edge ends are extracted.

④ A subgraph formed from the vertices (reference vertex, vertices having the same outgoing edge ends with the reference vertex, and the vertices of the edge ends) and the edges is extracted.

The subgraph extraction section 13 determines whether a subgraph has been successfully extracted at step 23 (step 24).

When it is determined at step 24 that a "subgraph" has been successfully extracted, the subgraph extraction section 13 delivers the subgraph to the subgraph transformation section 14.

The subgraph transformation section 14 transforms the subgraph extracted by the subgraph extraction section 13 so that the number of edges and the number of flip-flops (a total number of flip-flops indicated by flip-flop information recorded on the edges) may be reduced (step 25).

The transformation of the subgraph is performed in a procedure including the steps ① to ④ described below:

① Find a location of the extracted subgraph wherein input vertices (vertices of edge origins (tails of edges)) and output vertices (vertices of edge ends) are present and each of the input vertices and each of the output vertices are connected to each other by an edge (when plural locations are present, they are extracted in order of the number of output vertices).

② An intermediate vertex is generated newly, and edges from the input vertices to the intermediate vertex and edges from the intermediate vertex to the output vertices are generated. As a result, reduction in number of edges and reduction in number of flip-flops represented by flip-flop information recorded in the reduced edges can be achieved.

③ When such location as described in ① is not present any more, then, for each vertex of the subgraph it is discriminated "whether the vertex has incoming edges and information of one or more flip-flops (the number of flip-flops) is recorded on all of the edges" and "whether the vertex has outgoing edges and information or one or more flip-flops (the number of flip-flops) is recorded on all of the edges".

④ When it is discriminated at ③ that "a vertex (called "Px") has incoming edges and information of one or more flip-flops is recorded on all of the edges", new edge, on which the lowest one of values of the flip-flop information recorded on the incoming edges of Px (a new edge which has the vertex Px as an output vertex and has the new intermediate vertex as an input vertex) is recorded, is set and an output vertex of the incoming edges of Px is set to the intermediate vertex (these edges become incoming edges of the intermediate vertex), and the numbers of the flip-flop information recorded on the new edge are subtracted from the flip-flop information recorded on the incoming edges. Similarly, when it is discriminated that at ③ that a vertex (called "Qy") has a outgoing edges and information of one or more flip-flops is recorded on all of the edges, new edges, on which the lowest one of values of the flip-flop information recorded on the edges (a new edge, which has the vertex Qy as an input vertex and has the new intermediate vertex as an output vertex) is recorded, is set and the input vertices of the incoming edges are set to the intermediate vertices (these edges become outgoing edges of the intermediate vertex), and the numbers of the flip-flop information recorded on the new edge are subtracted from the flip-flop information recorded on the outgoing edges. In other words, the subgraph is transformed so that common edges for recording a common flip-flop number and an intermediate vertex for setting the edges may be provided. As a result, reduction in number of flip-flops can be achieved.

In this manner, the circuit area and the number of flip-flops of a subnetwork corresponding to a subgraph can be reduced by transforming the subgraph.

The subnetwork addition section 15 generates a subnetwork corresponding to the subgraph transformed by the subgraph transformation section 14 (step 26) and adds the subnetwork to the sequential network of the object of optimization (step 27). The addition of the subnetwork can be performed without changing the circuit logic of the sequential network inputted by the circuit inputting section 11. Further, since the subnetwork can include, in addition to a plurality of gates and a plurality of wiring lines, a plurality of flip-flops, the subnetwork can be added across flip-flops of the sequential network inputted by the circuit inputting section 11. Such addition of a subnetwork corresponds to taking the circuit logic across flip-flops into consideration.

The redundancy removal section 16 extracts redundancies (redundant portions) created by the addition of the subnetwork to the sequential network by the subnetwork addition section 15 (redundant portions in the sequential network which are generated in other portions than the added subnetwork) and removes the redundancies (step 28).

The extraction and removal of redundancies are performed in accordance with a procedure including the following steps ① to ⑤:

① Notice is successively taken of the input wiring lines of the subnetwork (the input wiring line noticed is denoted as wiring line P).

② A connection location which exists without any gate or any flip-flop interposed from the wiring line P (where the wiring line branches without any gate or any flip-flop interposed therebetween, a connection location for each branch) is extracted.

③ It is discriminated whether, at at least one location on each path from the connection location extracted at ② to the primary output wiring lines of the sequential network, a wiring line corresponding to an output wiring line of the subnetwork is present.

④ When it is discriminated at ③ that "a wiring line is present", the connection location is removed (the connection location is cut on the circuit).

⑤ A gate or a flip-flop the number of whose inputs has reduced to 0 as a result of the removal at ④ is removed.

Since such extraction and removal of redundancies can be determined readily from the subgraph transformed by the subgraph transformation section 14, high speed removal of redundancies can be achieved. By the redundancy removal, wiring lines, gates and flip-flops can be removed by a large number.

When it is discriminated at step 23 that "no subgraph has been extracted successfully" (a subgraph which can be extracted is not present any more), the subgraph extraction section 13 transfers its control to the circuit outputting section 17 together with the sequential network (the sequential network to which the subnetwork has been added and from which the redundancies have been removed).

The circuit outputting section 17 outputs the sequential network (sequential network after optimization) (step 29), thereby ending the entire processing of the sequential network optimization designing apparatus of the present embodiment.

According to optimization by the sequential network optimization designing apparatus of the present embodiment, since the circuit area and the number of flip-flops of a subnetwork (subnetwork generated and added by the subnetwork addition section 15) can be reduced by a great amount by transforming the subgraph by section of the subgraph transformation section 14 and a large number of redundant circuit portions (redundancies of a sequential network to which a subnetwork is added), the circuit size and the number of flip-flops of a sequential network inputted by the circuit inputting section 11 can be reduced by a large number.

Subsequently, detailed operation of the sequential network optimization designing apparatus of the present embodiment will be described with reference to FIGS. 3 to 9.

First, operation of the flip-flop information attached transitive implication graph production section 12 will be described with reference to FIGS. 3 and 4.

Figure 3:
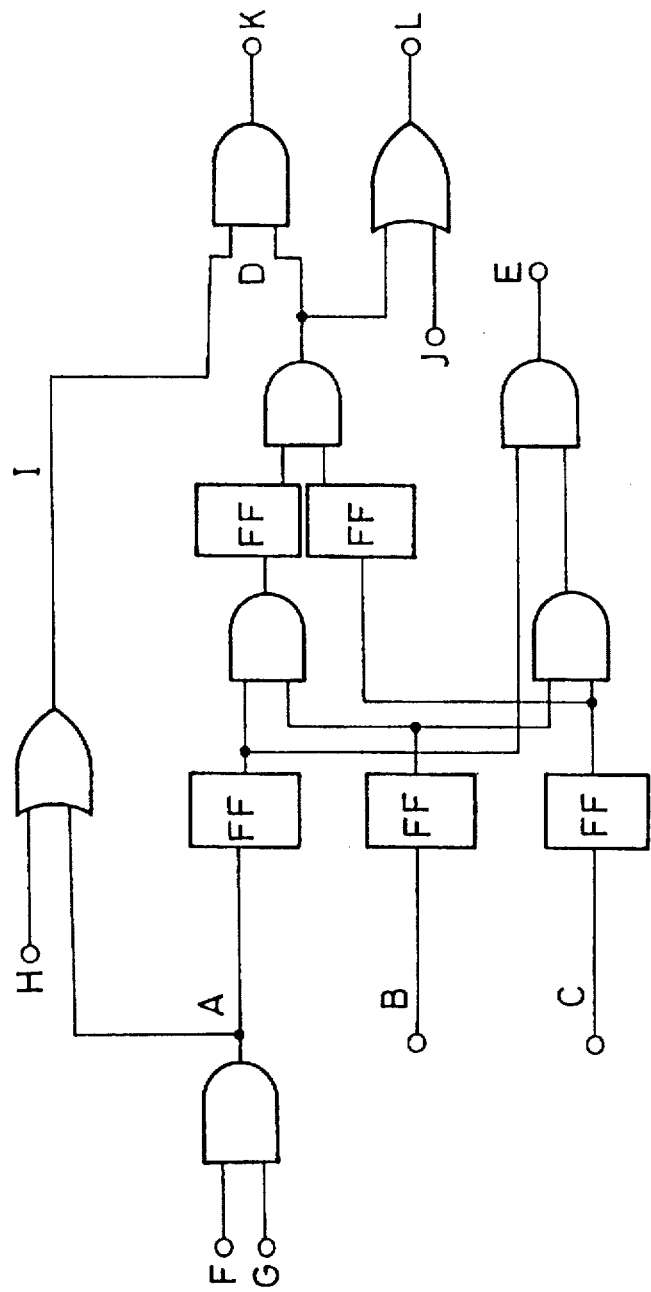
FIGS. 3 to 9 are diagrammatic views illustrating different steps of an optimization procedure by the sequential network optimization designing apparatus of FIG. 1.
Figure 4:
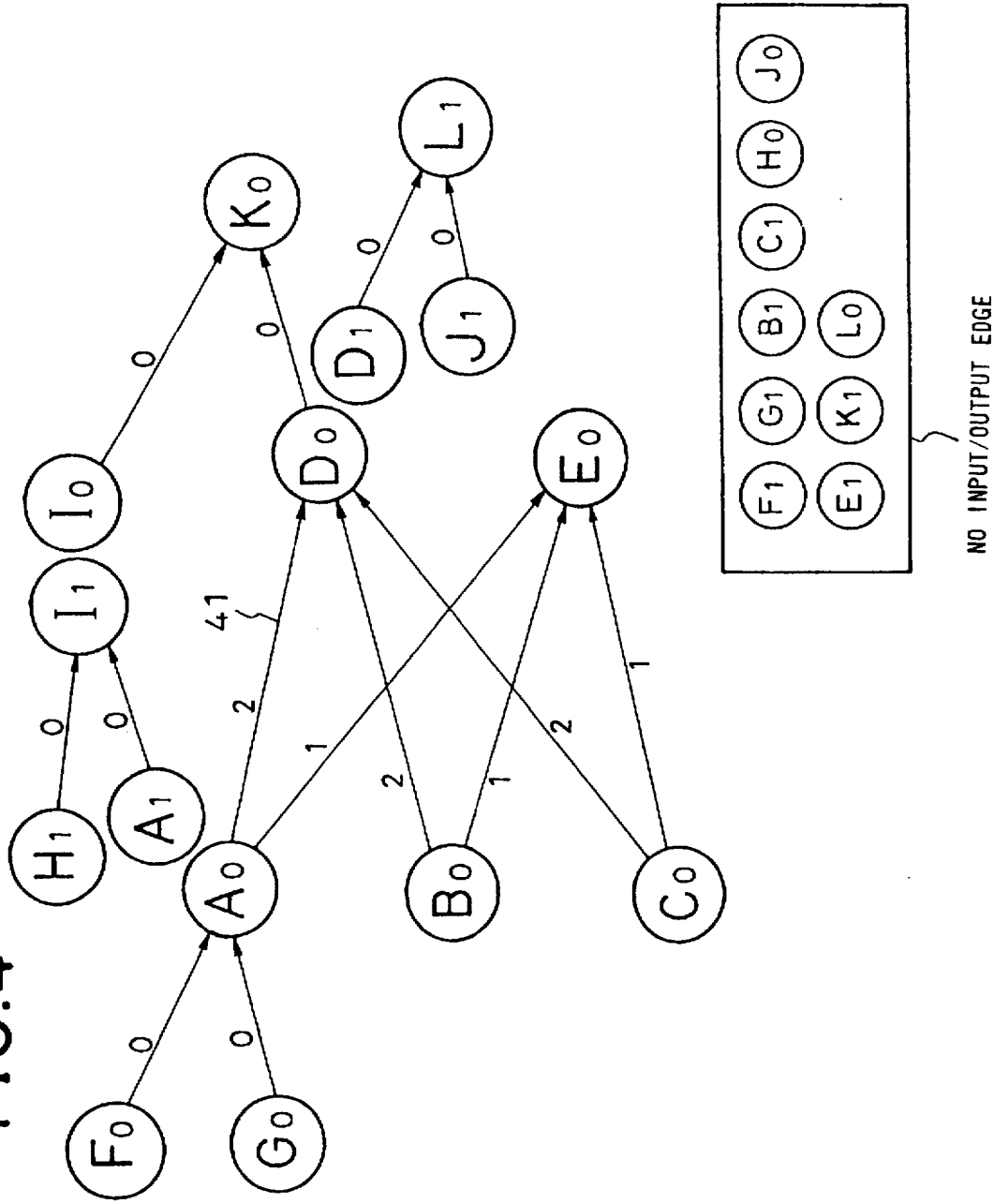

The flip-flop information attached transitive implication graph production section 12 produces a flip-flop information attached transitive implication graph shown in FIG. 4 based on a sequential network inputted by the circuit inputting section 11 (a sequential network shown in FIG. 3).

In the sequential network shown in FIG. 3, for example, when the value of the wiring line A changes to "0", the value of the wiring line D changes to "0" without fail after a time delay corresponding to two flip-flops (a period of two clocks). Such implication relationship (that there is an implication from that the the value of the wiring line A is "0" (A=0) to that the value of the wiring line D is "0" (D=0)) is indicated, in the flip-flop information attached transitive implication graph shown in FIG. 4, by an edge 41 which is a single line from a vertex $A_0$ to another vertex $D_0$. Further, the fact that the implication relationship arises from two flip-flops is indicated by "2" additionally marked in the proximity of the line of the edge 41, representing that "2" is recorded as flip-flop information.

Subsequently, operation of the subgraph extraction section 13 will be described with reference to FIGS. 4 and 5.

Figure 5:
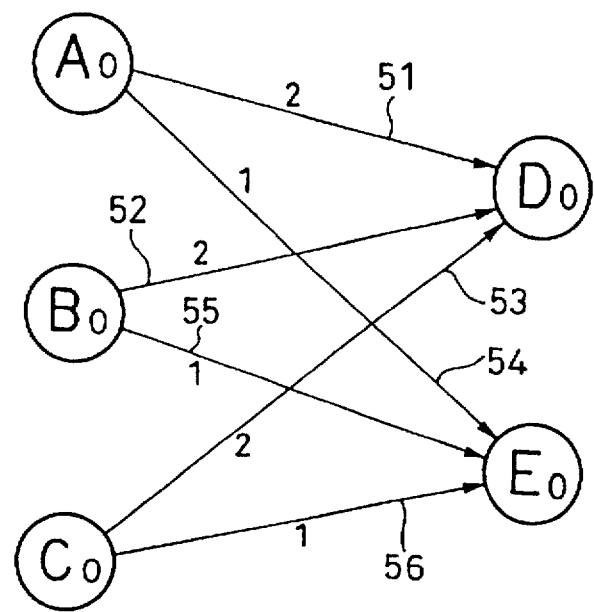

The subgraph extraction section 13 extracts, for example, a subgraph shown in FIG. 5 from the flip-flop information attached transitive implication graph of FIG. 4.

Extraction of a flip-flop information attached transitive implication graph is performed, as described hereinabove, regarding each vertex of the flip-flop information attached transitive implication graph as a reference vertex.

The subgraph shown in FIG. 5 is a subgraph extracted in connection with the vertex $B_0$ as a reference vertex and includes the vertex $B_0$ itself, the vertices $A_0$ and $C_0$ with which the vertex $B_0$ has the same outgoing edge ends, edges 51, 52, 53, 54, 55 and 56 which are the outgoing edges of the vertices $A_0$, $B_0$ and $C_0$, and the vertices $D_0$ and $E_0$ which are output ends (edge ends) of the edges 51 to 56.

Subsequently, operation of the subgraph transformation section 14 will be described with reference to FIGS. 5 to 7.

The subgraph transformation section 14 transforms the subgraph extracted from the flip-flop information attached transitive implication graph such that the number of edges and the number of flip-flops (a total number of flip-flops represented by flip-flop information recorded on the relevant edges) may be reduced.

Upon transformation of, for example, the subgraph shown in FIG. 5, taking notice of the fact that, when the vertices $A_O$, $B_O$ and $C_O$ are regarded as input vertices and the vertices $D_O$ and $E_O$ are regarded as output vertices, the edges 51 to 56 from the vertices $A_O$, $B_O$ and $C_O$ to the vertices $D_O$ and $E_O$ are present, transformation at the following ① is performed first.

Figure 6:
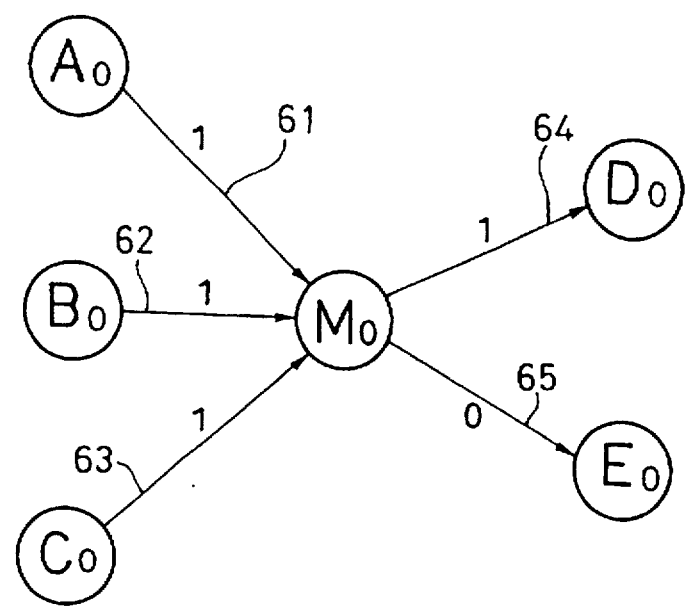

① As shown in FIG. 6, an intermediate vertex $M_O$ is generated newly, and the edges from the vertices $A_O$, $B_O$ and $C_O$ to the vertices $D_O$ and $E_O$ are transformed so that all of them may pass the vertex $M_O$ (sets edges 61 to 65). As a result, the number of edges is reduced from 6 to 5. Further, such transformation decreases not only the number of edges but also the total number of flip-flops represented by all of the flip-flop information on the subgraph. In particular, while the total number of flip-flops in the subgraph shown in FIG. 5 is 9 (2+1+2+1+2+1=9), the total number of flip-flops in the subgraph shown in FIG. 5 is 4 (1+1+1+1+0)=4).

Further, taking notice of the fact that, on the subgraph shown in FIG. 6, all of the flip-flop information on the edges 61 to 63 which are input edges of the vertex $M_O$ is "1", transformation at the following ② is performed.

Figure 7:
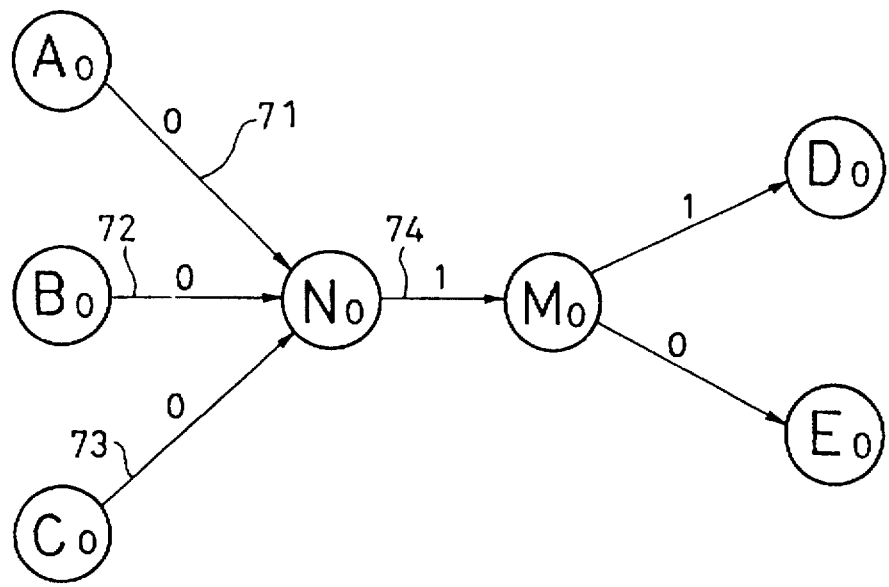

② The subgraph shown in FIG. 6 is transformed such that, as shown in FIG. 7, an edge 74 and an intermediate vertex $N_O$ for unifying the common flip-flop information are provided so that the flip-flop information on edges 71 to 73 has the value "0" and the flip-flop information of an edge 74 has the value "1". As a result, the total number of flip-flops is reduced from 4 in FIG. 6 to 2 in FIG. 7.

Such transformation of a subgraph as is performed by the process including the steps ① and ② described above can reduce the number of edges and the number of flip-flops.

Subsequently, operation of the subnetwork addition section 15 will be described with reference to FIGS. 7 and 8.

The subnetwork addition section 15 generates, from such a subgraph after transformation as shown in FIG. 7 (subgraph which includes reduced numbers of edges and flop-flops), a subnetwork which corresponds to the subgraph and which maintains the circuit logic of the sequential network inputted by the circuit inputting section 11 (subnetwork which can be added to the subnetwork).

Figure 8:
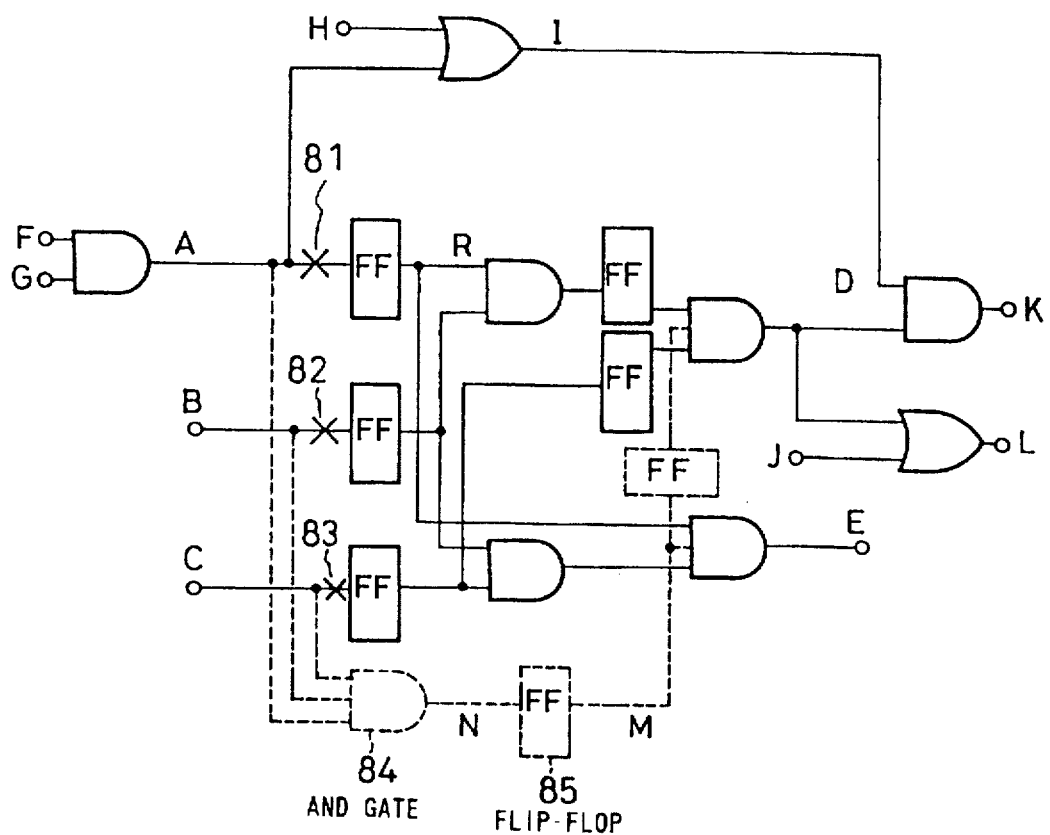

For example, in the subgraph shown in FIG. 7, since the edge 71 from the vertex $A_O$ to the vertex $N_O$ whose flip-flop information is "0" is present, a subnetwork indicated by broken lines in FIG. 8 includes an AND gate 84 which has a wiring line A as an input and has another wiring line N as an output. Further, since the edge 74 whose flip-flop information is "1" (edge from the vertex $N_O$ to the vertex $M_O$) is present in FIG. 7, the subnetwork indicated by broken lines in FIG. 8 includes a flip-flop 85 which has the wiring line N as an input and has another wiring line M as an output.

Figure 9:
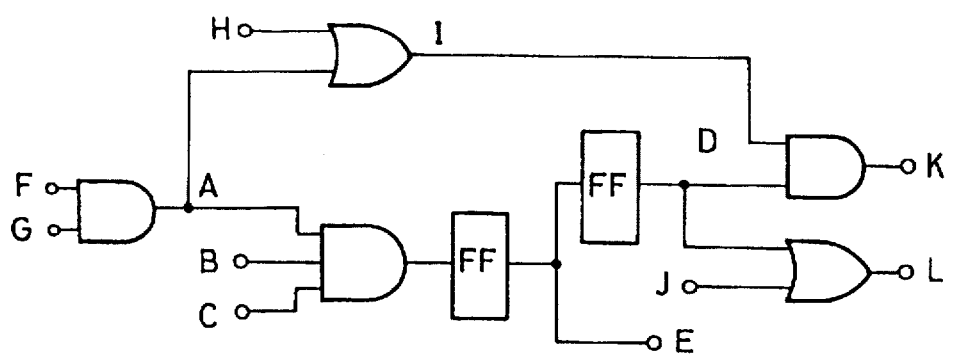

Subsequently, operation of the redundancy removal section 16 will be described with reference to FIGS. 8 and 9.

If addition of a subnetwork to a sequential network of an object of optimization is performed by the subnetwork addition section 15, then some redundancies are sometimes created in the sequential network by the addition. The redundancy removal section 16 performs extraction and removal of such redundancies in the procedure described hereinabove.

For example, in the circuit shown in FIG. 8 (a sequential network to which a subnetwork is added), as a result of addition of the subnetwork indicated by broken lines, connection locations 81, 82 and 83 become redundant and can be removed (the connection locations 81 to 83 can be cut). This is because, taking the collection location 81 as an example, after a period of 2 cycles from a point of time when the value of the wiring line A changes to "0" (after a time delay corresponding to two flip-flops), the value of the wiring line D changes to "0" with the added subnetwork, and after a period of one clock, the value of the wiring line E changes to "0". Consequently, in this instance, propagation of a value from the connection location 81 does not have an influence upon the primary output values. On the other hand, when the value of the wiring line A changes to "1", an influence of the value does not propagate to the value of the wiring line R through the connection location 81. Consequently, the connection location 81 is redundant.

After such redundant connection locations 81 to 83 are extracted, they are removed.

Further, those wiring lines, gates and flip-flops which have lost their inputs by such removal of redundant portions can be removed. As a result, such a sequential network as shown in FIG. 9 is generated as an "optimized sequential network".

Having now fully described the invention, it will be apparent to one of ordinary skill in the art that many changes and modifications can be made thereto without departing from the spirit and scope of the invention as set forth herein.

What is claimed is:

1. A sequential network optimization designing apparatus, comprising:

circuit inputting means for inputting a multi-level sequential network of an object of optimization;

transitive implication graph production means for producing a transitive implication graph including flip-flop information that corresponds to the sequential multi-level network;

subgraph extraction means for extracting a subgraph from the transitive implication graph;

subgraph transformation means for transforming the subgraph extracted by said subgraph extraction means so as to decrease simultaneously effect a decrease in the number of edges and the number of flip-flops of the subgraph;

subnetwork addition means for generating a subnetwork corresponding to the subgraph transformed by said subgraph transform means and for adding the subnetwork to the multi-level sequential network;

redundancy removal means for removing redundancies created in the multi-level sequential network by the addition of the subnetwork by said subnetwork addition means; and circuit outputting means for outputting the multi-level sequential network optimized by the addition of the subnetwork by said subnetwork addition means and the removal of the redundancies by said redundancy removal means.

2. A sequential network optimization designing apparatus as claimed in claim 1, wherein said transitive implication graph production means produces a transitive implication graph in which, where a wiring line P and another wiring line Q in the sequential network of the object of optimization are presumed, an edge from a vertex Px to another vertex Qy is present when conditions that "there is the wiring line Q on the output side of the wiring line P", that "there is an implication from P=x to Q=y", that "where the wiring line P is a wiring line other than primary input wiring lines of the multi-level sequential network of the object of optimization, at least one wiring line of the output wiring lines of the wiring line P does not have an implication from P=x", that "where the wiring line Q is a wiring line other than primary output wiring lines of the multi-level sequential network of the object of optimization, at least one wiring line of the output wiring lines of the wiring line Q does not have an implication from Q=y" and that "all wiring lines which are on paths from the wiring line P to the wiring line Q have an implication from P=x" are met.

3. A sequential network optimization designing apparatus as claimed in claim 1, wherein said flip-flop information attached transitive implication graph production means produces a flip-flop information attached transitive implication graph in which, where a wiring line P and another wiring line Q in the multi-level sequential network of the object of optimization are presumed, an edge from a vertex Px to another vertex Qy is present when conditions that, "in the sequential network of the object of optimization, there is the wiring line Q on the output side of the wiring line P", that "there is an implication from P=x of Q=y", that "there is no implication from a wiring on the input side of the wiring line P of A=x" and that "there is no implication from B=y of a wiring line on the output side of the wiring line B" are met.

* * * * *

UNITED STATES PATENT AND TRADEMARK OFFICE
CERTIFICATE OF CORRECTION

PATENT NO. : 5,761,487
DATED : 6/2/98
INVENTOR(S) : Yuguchi

It is certified that error appears in the above-identified patent and that said Letters Patent is hereby corrected as shown below:

Please substitute claims 1 and 2 to read as follows:

1. A sequential network optimization designing apparatus, comprising:

circuit inputting means for inputting a multi-level sequential network of an object of optimization;

transitive implication graph production means for producing a transitive implication graph including flip-flop information that corresponds to the sequential multi-level network;

subgraph extraction means for extracting a subgraph from the transitive implication graph;

subgraph transformation means for transforming the subgraph extracted by said subgraph extraction means so as to [decrease] simultaneously effect a decrease in the number of edges and the number of flip-flops of the subgraph;

subnetwork addition means for generating a subnetwork corresponding to the subgraph transformed by said subgraph transform means and for adding the subnetwork to the multi-level sequential network;

UNITED STATES PATENT AND TRADEMARK OFFICE
CERTIFICATE OF CORRECTION

PATENT NO.  : 5,761,487
DATED       : 6/2/98
INVENTOR(S) : Yuguchi

It is certified that error appears in the above-identified patent and that said Letters Patent is hereby corrected as shown below:

redundancy removal means for removing redundancies created in the multi-level sequential network by the addition of the subnetwork by said subnetwork addition means; and circuit outputting means for outputting the multi-level sequential network optimized by the addition of the subnetwork by said subnetwork addition means and the removal of the redundancies by said redundancy removal means.

2.    A sequential network optimization designing apparatus as claimed in claim 1, wherein said transitive implication graph production means produces a transitive implication graph in which, where a wiring line P and another wiring line Q in the sequential network of the object of optimization are presumed, an edge from a vertex Px to another vertex Qy is present when conditions that "there is the wiring line Q on the output side of the wiring line P", that "there is an implication from P = x [to] of Q = y", that "where the wiring line P is a wiring line other than primary input wiring lines of

UNITED STATES PATENT AND TRADEMARK OFFICE
CERTIFICATE OF CORRECTION

PATENT NO. : 5,761,487

DATED : 6/2/98

INVENTOR(S) : Yuguchi

It is certified that error appears in the above-identified patent and that said Letters Patent is hereby corrected as shown below:

the multi-level sequential network of the object of optimization, at least one wiring line of the output wiring lines of the wiring line P does not have an implication from P = x", that "where the wiring line Q is a wiring line other than primary output wiring lines of the multi-level sequential network of the object of optimization, at least one wiring line of the output wiring lines of the wiring line Q does not have an implication from Q = y" and that "all wiring lines which are on paths from the wiring line P to the wiring line Q have an implication from P = x" are met.

Signed and Sealed this

Ninth Day of February, 1999

Attest:

Attesting Officer

*Acting Commissioner of Patents and Trademarks*